(12) United States Patent
Johnson

(10) Patent No.: US 6,501,152 B1
(45) Date of Patent: Dec. 31, 2002

(54) ADVANCED LATERAL PNP BY IMPLANT NEGATION

(75) Inventor: F. Scott Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/371,645

(22) Filed: Aug. 10, 1999

Related U.S. Application Data

(60) Provisional application No. 60/107,199, filed on Nov. 5, 1998.

(51) Int. Cl.[7] ............................................. H01L 29/00
(52) U.S. Cl. ........................ 257/558; 257/557; 257/347; 438/316; 438/325
(58) Field of Search .................................. 257/370, 511, 257/525, 347, 587, 588, 557–561, 575, 576, 165, 338, 373, 401, 574, 593; 438/202, 204, 234, 311, 316, 325, 236, 335

(56) References Cited

U.S. PATENT DOCUMENTS

| | | | |
|---|---|---|---|
| 5,717,241 A | * 2/1998 | Malhi et al. | 257/378 |
| 5,965,923 A | * 10/1999 | Prall et al. | 257/370 |
| 6,157,065 A | * 12/2000 | Huang et al. | 257/355 |
| 6,281,530 B1 | * 8/2001 | Johnson | 257/223 |

* cited by examiner

*Primary Examiner*—Steven Loke
*Assistant Examiner*—Donghee Kang
(74) *Attorney, Agent, or Firm*—Jacqueline J. Garner; W. James Brady, III; Frederick J. Telecky, Jr.

(57) ABSTRACT

A lateral NPN transistor (LPNP) (102) having the lightly doped drain extension implant blocked from the emitter region (118) but not the collector region (120). Accordingly, the emitter region (118) has a more abrupt junction for high emitter injection efficiency while the collector region (120) has a lightly doped region for reduced base depletion.

5 Claims, 5 Drawing Sheets

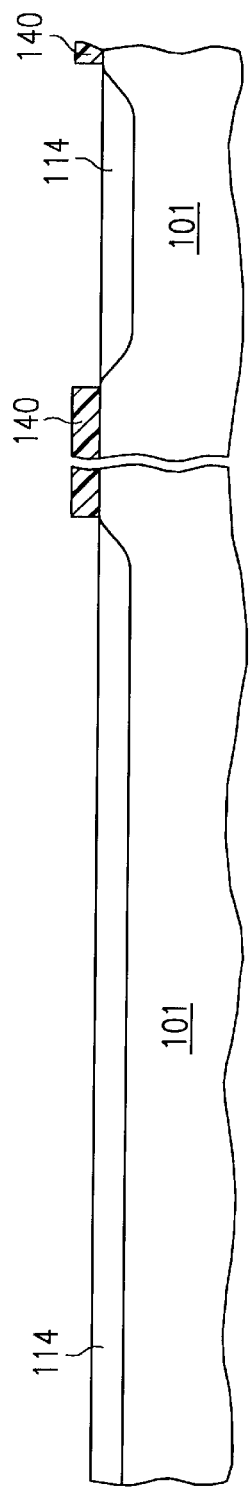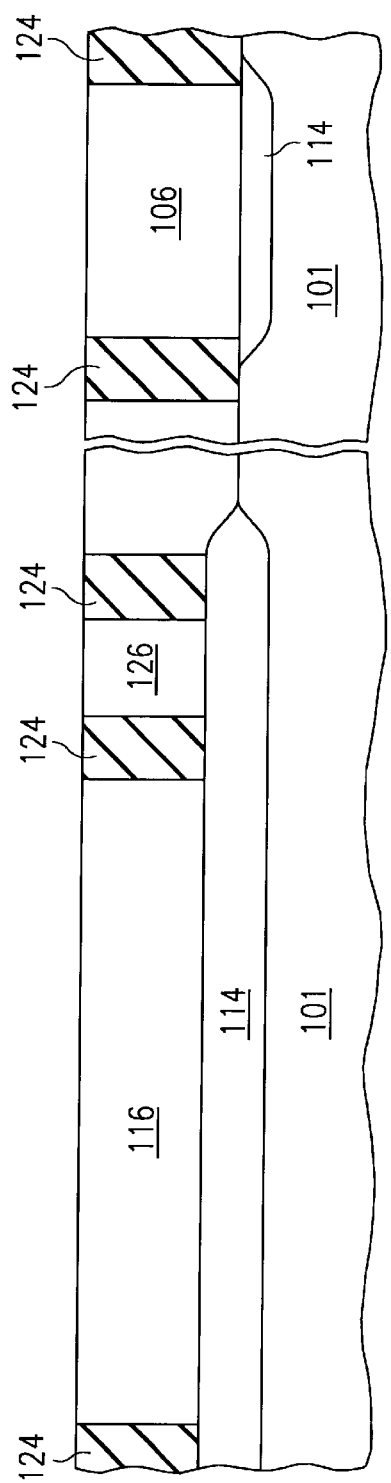
FIG. 8A
FIG. 8B

ADVANCED LATERAL PNP BY IMPLANT NEGATION

This application claim priority under 35 USC §119(e)(1) of provisional application No. 60/107,199 filed Nov. 11, 1998.

FIELD OF THE INVENTION

The invention is generally related to the field of forming bipolar transistors and more specifically to a method of forming a lateral bipolar transistor using a BiCMOS process.

BACKGROUND OF THE INVENTION

Lateral PNP bipolar transistors (LPNPs) are desired for many mixed signal integrated circuit (IC) designs. Mixed signal ICs combine both digital and analog circuitry and thus typically comprise CMOS transistors as well as NPN bipolar transistors, high performance capacitors, LPNPs and sometimes resistors. LPNPs may be used in applications such as current mirrors, active loads, and complementary bipolar logic. An example of a critical circuit application for a LPNP is the filter null circuit where the LPNP current mirror has been shown to out-perform the best design using a PMOS based current mirror. The LPNP has higher dynamic range, higher transconductance, lower parasitic capacitance, low operating voltage, higher bandwidth (3×PMOS), less gain variation due to output voltage, and lower DC offset voltage. As a result, LPNPs are very desirable for hard disk drive (HDD) applications.

A typical LPNP design for a mixed signal IC is shown in FIG. 1. Because the LPNP is formed using a BiCMOS process, the formation of the LPNP is designed to use as many of the steps for forming the CMOS transistors as possible. A N+ buried layer 14 is formed in a substrate 12 and functions as the low resistance base of the LPNP 10. N-well 16 is the base of the LPNP 10. The emitter 18 and collector 20 are formed in N-well 16 using a standard p+ source/drain (S/D) and drain extension implants. The polysilicon (poly) gate electrode 22 is tied to the emitter region 18. LPNP 10 is essentially an inherent PNP of a PMOS transistor optimized for PNP performance. Isolation regions 24 isolate LPNP 10 from other devices (not shown) and from the base contact 26.

There are two dominant currents in LPNP 10. The first is the base or parasitic current. The base current is the electrons and holes injected vertically between the n-well 16 and emitter 18 junction area. The second dominant current is the collector or active current. The collector current is the holes diffused laterally through the "channel" region 28 of the base n-well 16 between the emitter 18 and collector 20.

LPNPs achieve gain from the active current. However, the gain is reduced by the parasitic current. The gain (beta) of the LPNP is proportional to the ratio of the periphery to the area of the emitter S/D diffusion or the ratio of the active to parasitic base-emitter junction. As a result, Beta is proportional to 1/(length of the polysilicon gate):1/(base width). Accordingly, the gain (beta) can be increased by decreasing the poly gate length. However, since the collector and emitter profiles are constant (i.e., fixed by the CMOS design parameters), the early voltage is proportional to the length of the polysilicon gate 22. (The early voltage is proportional to the sum of the active base doping.) Thus. increasing the gate length improves the early voltage. As a result, the beta*early voltage product, a measure of the performance of the LPNP, is relatively constant for a given CMOS technology regardless of base width.

The LPNP typically uses a layout having a circular collector to improve the periphery to area ratio of the emitter. FIG. 2 shows a cross-section of a circular collector LPNP 10 and FIG. 3 is a top view of the same device. A gate length of 0.6 microns results in a beta (gain) of 16 and an early voltage of 12, for a total product of 192. If the gate length is increased to 0.8 microns, the beta is 9 and the early voltage is 20 for a product of 180. The different is relatively insubstantial. For HDD applications, both a beta and early voltage of 20 is desired. Accordingly, improvements in the gain and/or early voltage are needed without substantial increases in process cost.

SUMMARY OF THE INVENTION

A method of forming a LPNP transistor is disclosed herein. The standard CMOS drain extension implants are blocked from the emitter region, but not from the collector region of the LPNP. Accordingly, the emitter region has a more abrupt junction for high emitter injection efficiency while the collector region has a lightly doped region for reduced base depletion.

An advantage of the invention is providing a LPNP having improved beta (gain)*early voltage product.

This and other advantages will be apparent to those of ordinary skill in the art having reference to the specification in conjunction with the drawings.

BRIEF DESCRIPTION OF THE DRAWINGS

In the drawings:

FIGS. 8A–8D are cross-sectional diagrams of the LPNP transistor of FIG. 4 at various stages of fabrication.

DETAILED DESCRIPTION OF THE EMBODIMENTS

The invention is a lateral bipolar transistor design. It is described in conjunction with a BiCMOS device and method having both a lateral PNP (LPNP) and CMOS transistors. It will be apparent to those of ordinary skill in the art that the benefits of the invention may be applied to other processes and devices for which lateral bipolar transistor are desired, especially those devices requiring both CMOS and bipolar transistors.

Figure 1:
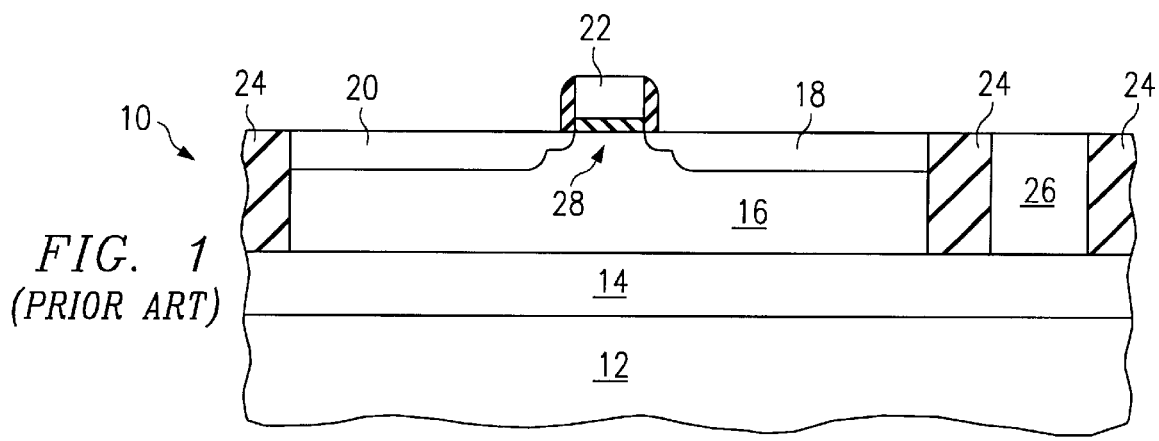
FIG. 1 is a cross-sectional diagram of a prior art LPNP transistor design.
Figure 2:
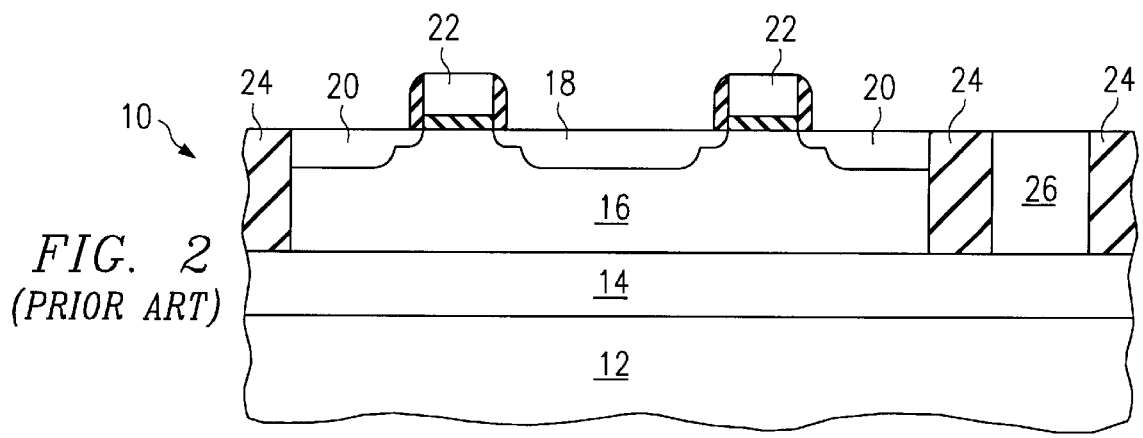
FIG. 2 is a cross-sectional diagram of a layout for a prior art LPNP transistor.
Figure 3:
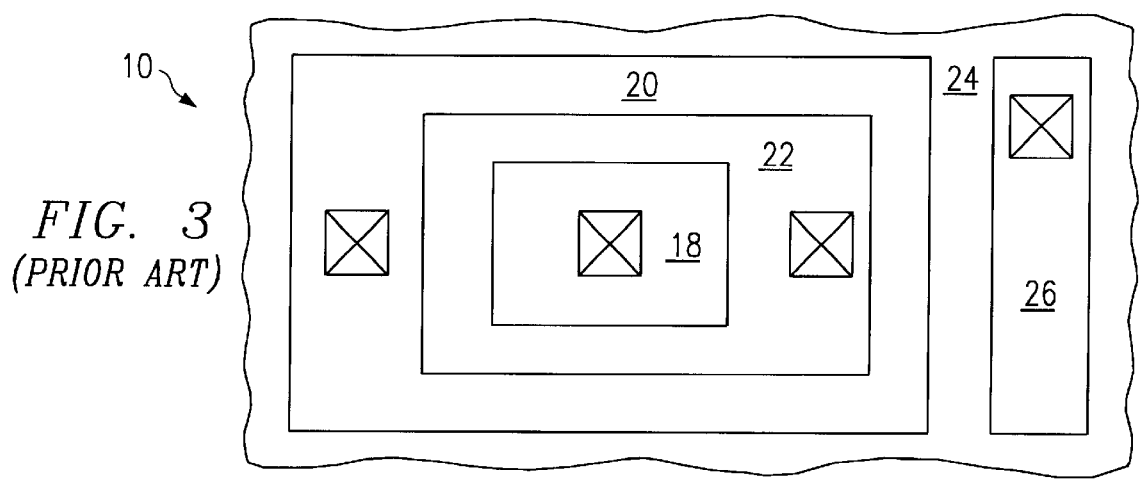
FIG. 3 is a top view of a layout for a prior art LPNP transistor.
Figure 4:
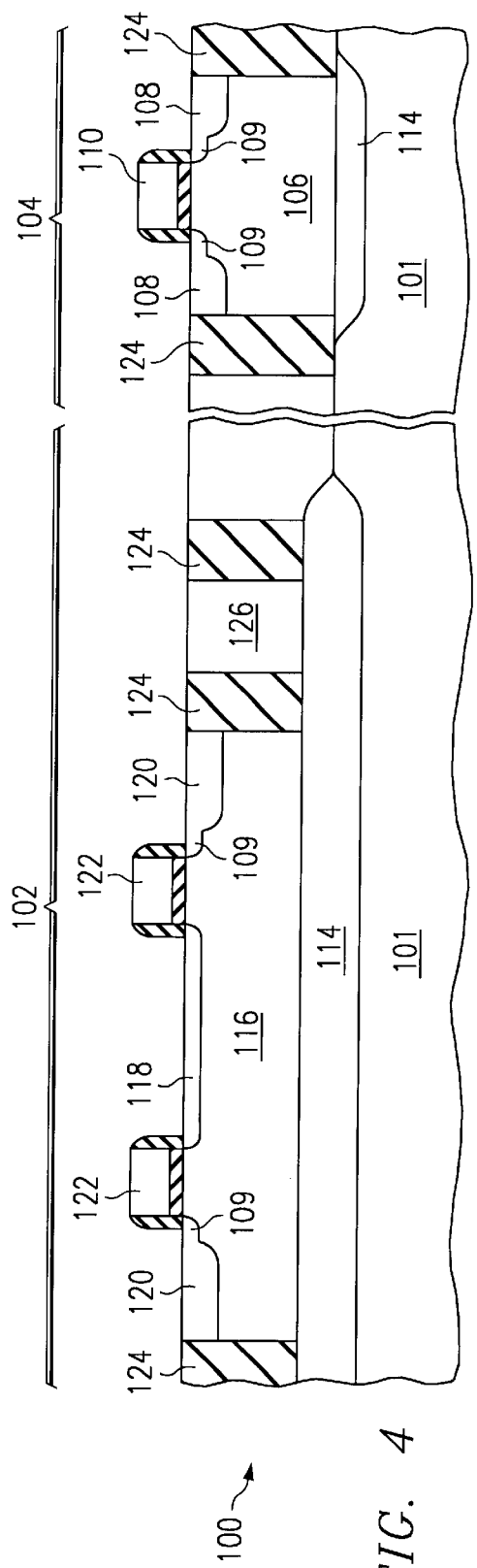
FIG. 4 is a cross-sectional diagram of a LPNP transistor according to the invention.

A BiCMOS device 100 having a LPNP 102 and a CMOS transistor 104 is shown in FIG. 4. CMOS transistor 104 is a standard p-type MOS transistor. It is formed in a n-well region 106 and includes p-type source/drain regions 108 and a gate electrode 110. Gate electrode 110 typically comprises polysilicon. Source/drain regions 108 may include drain extension regions 109 extending under sidewall spacers 111.

Because the LPNP 102 is formed using a BiCMOS process, the formation of the LPNP 102 is designed to use as many of the steps for forming the CMOS transistor 104 as possible in order to reduce cost. A n+ buried layer 114 forms a low resistance base region and is located below n-well 16. N-well 116 is similar to n-well 106 and forms the base of the LPNP 102. The emitter 118 and collector 120 are formed in n-well 116 and are similar to source/drain regions 108. However, the emitter region 118 does not include a drain extension region. Thus, the emitter 118-base 116 junction is an abrupt junction in the lateral direction. This results in high emitter injection efficiency and high gain. The collector region 120 does include a drain extension region 109. Thus, the collector junction is more gradual. This results in reduced base depletion and increased early voltage. The LPNP performance is optimized by improving both the beta (gain) and the early voltage. The non-symmetrical emitter and collector regions allow both the beta and early voltage to be optimized.

The gate electrode 122 is typically identical to the CMOS gate electrode 110 including sidewall spacers 111. The gate electrode 122 is tied to the emitter region 118. LPNP 102 is essentially an inherent PNP of a PMOS transistor connected for PNP operation. Isolation regions 124 isolate LPNP 102 and CMOS transistor 104 from each other and from other devices (not shown). An isolation region 124 is also used to separate n-well 116 from the base contact 126. N+ buried layer 114 provides a low resistance path from the base (n-well 116) under an isolation region 124 to the base contact 126.

There are two dominant currents in LPNP 102. The first is the base or parasitic current. The base current is the electrons and holes injected vertically between the n-well 116 and emitter 118 junction area along the length of the emitter region 118. The second dominant current is the collector or active current. The collector current is the holes diffused laterally through the "channel" region 128 of the base n-well 116 between the emitter 118 and collector 120.

Figure 5:
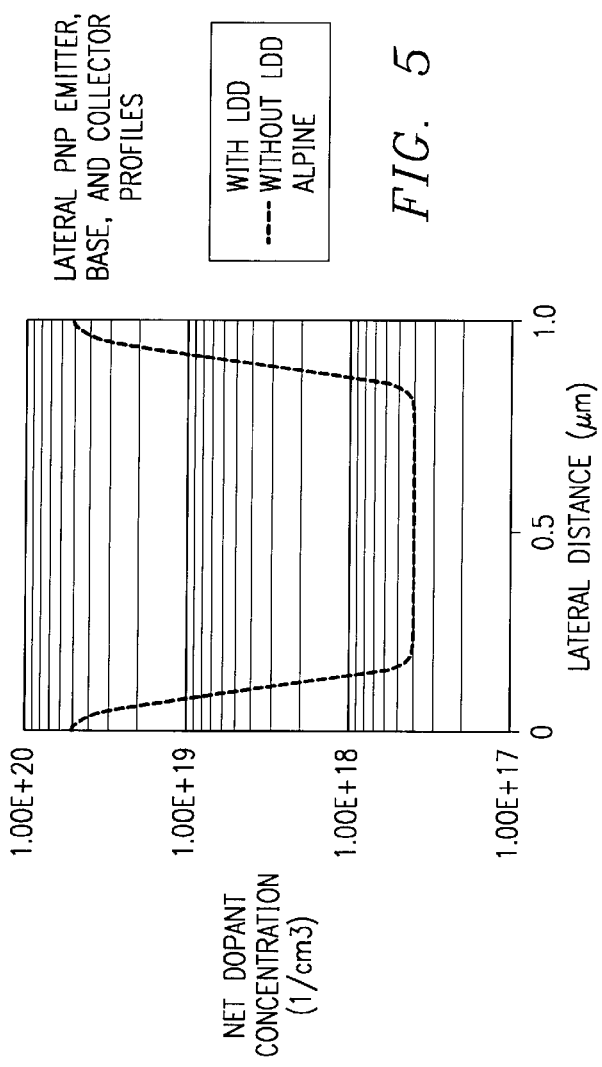
FIG. 5 is a graph of dopant profile for a prior art LPNP without LDD implant.
Figure 6:
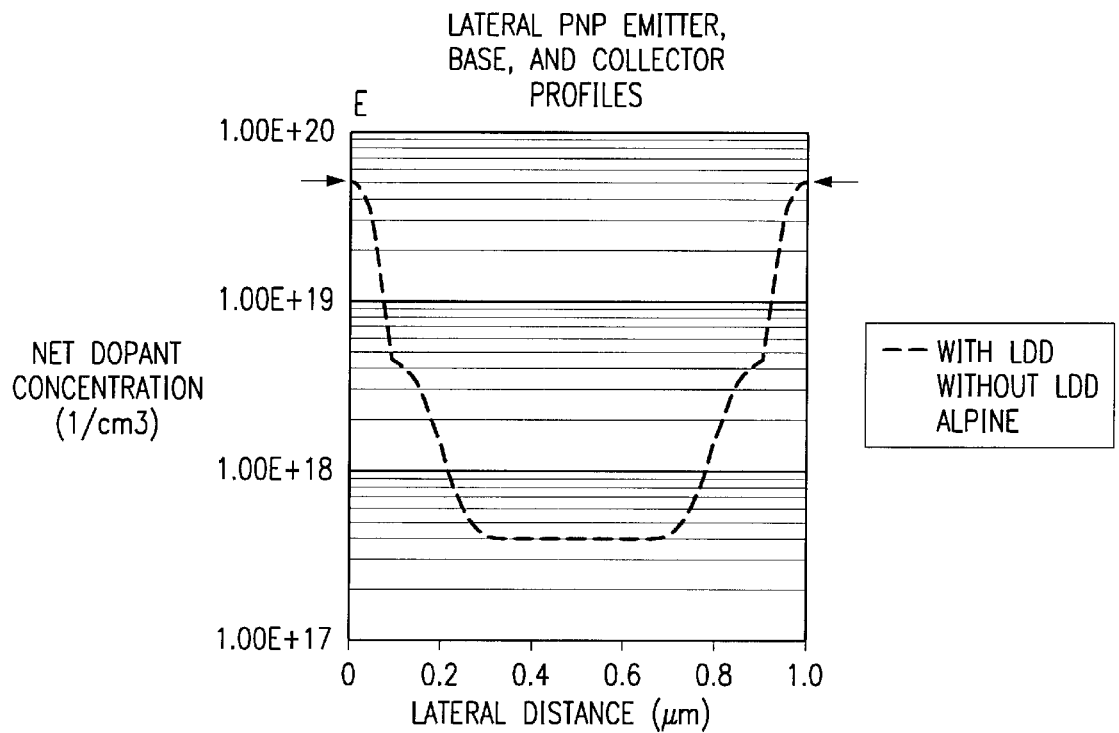
FIG. 6 is a graph of dopant profile for a prior art LPNP with LDD implant in both the emitter and collector regions.

In prior art LPNPs, the natural symmetry of the emitter and collector regions prevent any change in the beta*early voltage product. FIG. 5 shows the emitter, base and collector dopant profiles for a LPNP without a drain extension implant for either the emitter or collector. The abrupt junction on the collector side increases the base depletion. This, in turn, reduces the early voltage. So, while the abrupt emitter-base junction increases the beta, the early voltage decreased. Accordingly, the beta*early voltage product remains relatively unchanged. FIG. 6 shows the emitter, base and collector dopant profiles for a LPNP with a drain extension implant for both the emitter and collector. Here, the collector-base junction is more gradual resulting in reduced base depletion and increased early voltage. However, the gradual junction on the emitter side reduces the emitter injection efficiency and reduces the gain. So again, the beta*early voltage product remain relatively unchanged.

Figure 7:
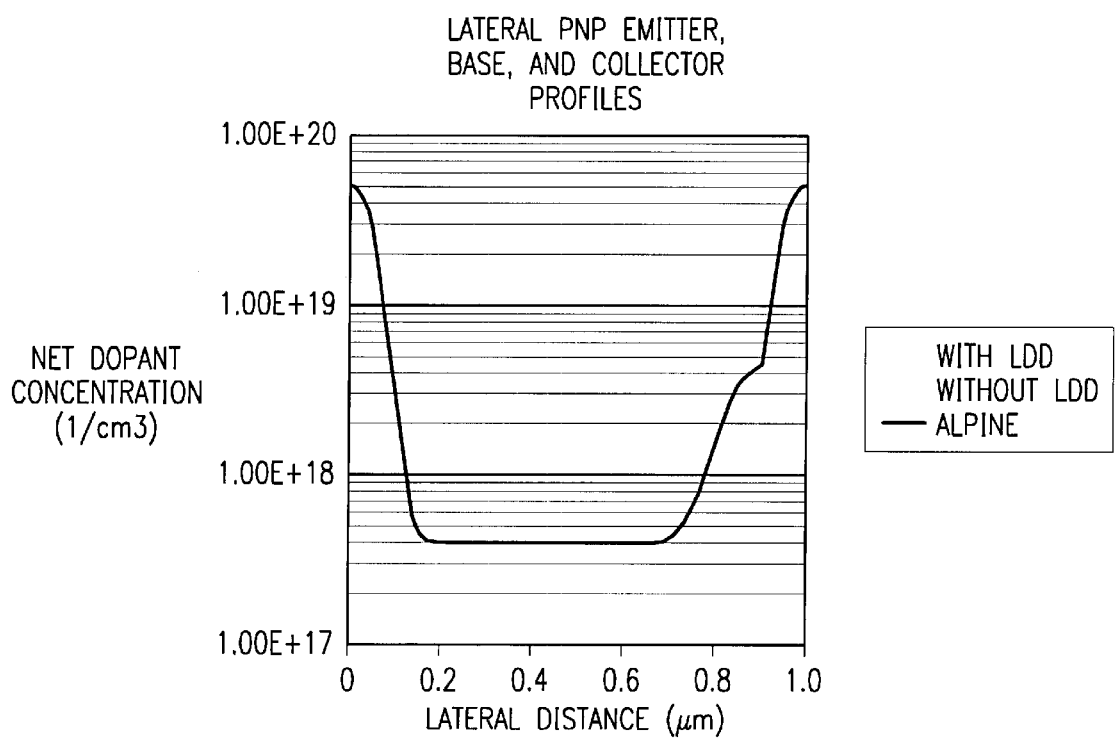
FIG. 7 is a graph of dopant profile for a LPNP according to the invention.

FIG. 7 shows the emitter, base, and collector dopant profiles for an LPNP according to the invention. The drain extension implant is blocked from the emitter region but not from the collector region. Accordingly, the emitter has an abrupt junction for high emitter injection efficiency and high gain and the collector has a more gradual junction for reduced base depletion and increased early voltage. The beta*early voltage product is improved.

A method for forming BiCMOS device 100 according to the invention will now be discussed with reference to FIGS. 8A–8C and FIG. 4. The invention may use a conventional BiCMOS process flow with a simple mask change to prevent the p-type drain extension implant from reaching the emitter region but allowing the p-type drain extension implant in the collector region. No additional masks are needed. The mask used to block the p+ drain extension implant from the NMOS regions (not shown) is modified to also block the implant from the emitter regions. As such, the invention can easily be incorporated into a variety of BiCMOS process flows. An exemplary flow will now be described.

Referring to FIG. 8A, a n+ buried layer 114 is selectively formed in substrate 101. The surface of substrate 101 is oxidized. A first mask is then used to remove the oxide 140 at the surface where buried n-type layers are desired. N+ buried layer 114 may then be formed by implantation of a n-type dopant such as arsenic or antimony. The dopant may be implanted at ~30 keV and ~$10^{15}$ atoms/cm$^2$ and then annealed to diffuse and active the dopant. N+ buried layer 114 may also be used for any NPN collectors (not shown) or under PMOS-wells, such as well 106, for reducing latch-up. Oxide layer 140 is then removed.

Referring to FIG. 8B, an intrinsic epitaxial layer 142 is then formed over the substrate 101 and n+ buried layer 114. N-well regions 116 and 106 are then implanted into the epitaxial layer 142 using a second masking layer (not shown). P-well regions (not shown) are also implanted into the epitaxial layer 142 using a third masking layer. The n-well and p-well doping levels are chosen to maximize CMOS performance. N-well region 116 forms the base of LPNP 102 and n+ buried layer 114 forms a low resistance base.

Next, isolation regions 124 are formed. Isolation regions 124 may, for example, shallow trench isolation. Other isolation structures are known in the art. Methods of forming shallow trench isolation regions are known in the art. Isolation regions 124 isolate LPNP 102 and CMOS transistor 104 from each other and other devices (not shown).

Then, a high energy, high dose n-type implant (e.g., phosphorous) and diffusion is then used to form base contact 126. This implant is the "deep N" implant that is typically used to contact any NPN collectors (not shown). An isolation region 124 also separates the collector 120 and base contact 126.

Figure 8C:
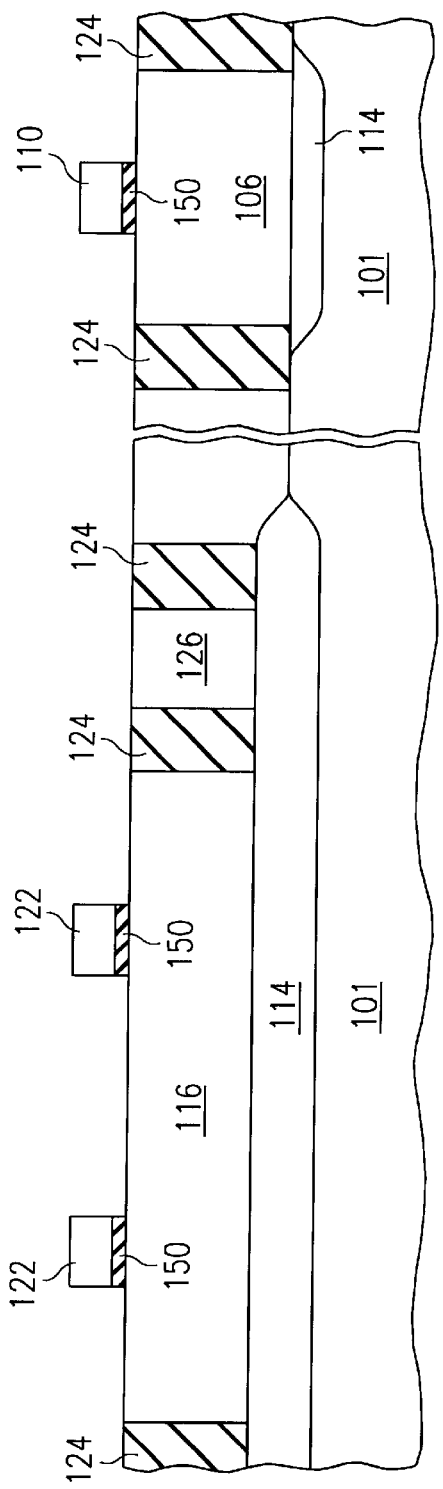

Referring to FIG. 8C, gate electrodes 122 and 110 are formed next. Typically, a gate dielectric 150, such as silicon dioxide, is formed on the surface of the semiconductor body 152. (Actually, it is the surface of the epitaxial layer 142. Hereinafter, the term semiconductor body will refer to the combined structure of the substrate 101 and epitaxial layer 142). Then, a layer of polysilicon is deposited, patterned and etched to form the gate electrodes 122 and 110.

Figure 8D:
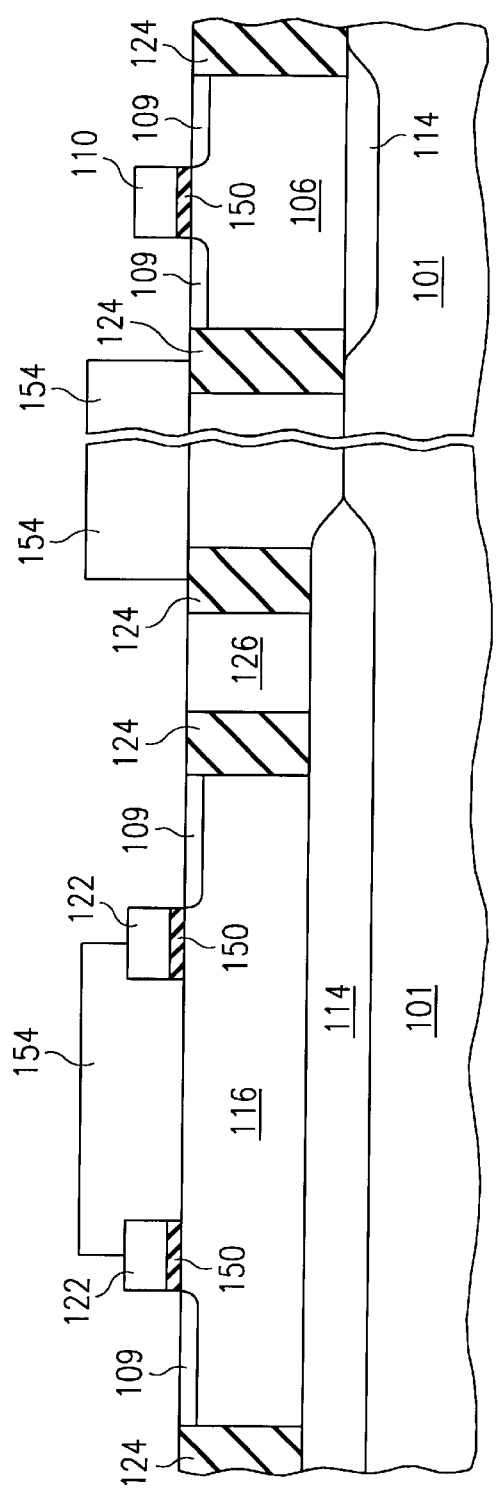

Next, p-type drain extension regions 109 are formed in the surface of the semiconductor body 152, as shown in FIG. 8D. A masking layer 154 is used to block the drain extension implant from the emitter region 118 but not from the collector region 120. Masking layer 154 is also used to block the p-type drain extension implant from the NMOS regions (not shown). The dopant concentration of drain extension regions 109 is optimized for CMOS performance.

Next, sidewall spacers 111 are formed on the sidewalls of the gate electrodes 122 and 110 as shown in FIG. 4. Sidewall spacers 111 typically comprise silicon nitride, silicon oxide, or a combination thereof. They are formed by deposition of the desired layers and anisotropic etchback. Then, p-type source/drain regions 108 are implanted and annealed. The collector region 120 and emitter region 118 are formed simultaneously with the p-type source/drain regions 108. Boron is typically used with the implant dose and energy being optimized for CMOS performance. Processing may then continue to form contacts and interconnect layers as is known in the art.

While this invention has been described with reference to illustrative embodiments, this description is not intended to be construed in a limiting sense. Various modifications and combinations of the illustrative embodiments, as well as other embodiments of the invention, such as switching the conductivity types of the elements, will be apparent to persons skilled in the art upon reference to the description. It is therefore intended that the appended claims encompass any such modifications or embodiments.

What is claimed is:

1. An integrated circuit having a lateral bipolar transistor comprising:

a base well region located in a semiconductor body;

a collector region located at a first portion of a surface of said base well region, said collector region including a lightly doped extension region;

an emitter region located at a second portion of a said surface of said n-well base region, said emitter region not having a lightly doped extension region; and a gate electrode located over a third portion of said surface of said base well region, said third portion located between said first and second portions.

2. The integrated circuit of claim 1 further comprising:

a buried layer forming a low resistance base region, said buried layer located below said base well region.

3. The integrated circuit of claim 2, further comprising a base contact isolated from said collector region for contacting said base well region through said buried layer.

4. The integrated circuit of claim 1, further comprising a plurality of CMOS transistors located in said semiconductor body but isolated from said lateral bipolar transistor.

5. The integrated circuit of claim 1, wherein said lateral bipolar transistor is a lateral PNP transistor.

* * * * *